United States Patent [19]
Witt et al.

[11] Patent Number: 5,831,462
[45] Date of Patent: *Nov. 3, 1998

[54] CONDITIONAL LATCHING MECHANISM AND PIPELINED MICROPROCESSOR EMPLOYING THE SAME

[75] Inventors: David B. Witt; Marty L. Pflum, both of Austin, Tex.

[73] Assignee: Advanced Micro Devices, Inc., Sunnyvale, Calif.

[*] Notice: The term of this patent shall not extend beyond the expiration date of Pat. No. 5,684,422.

[21] Appl. No.: 744,707

[22] Filed: Oct. 31, 1996

Related U.S. Application Data

[63] Continuation of Ser. No. 400,608, Mar. 8, 1995, abandoned.

[51] Int. Cl.$^6$ .................................................. H03K 3/037
[52] U.S. Cl. ........................................ 327/199; 327/208
[58] Field of Search ..................................... 327/199, 200, 327/201, 202, 203, 208, 210, 211, 212, 213, 214

[56] References Cited

U.S. PATENT DOCUMENTS

| | | | |
|---|---|---|---|
| 3,812,384 | 5/1974 | Skorup ..................................... | 327/203 |
| 4,339,808 | 7/1982 | North ....................................... | 395/732 |
| 4,495,629 | 1/1985 | Zasio et al. .............................. | 327/202 |
| 4,682,282 | 7/1987 | Beasley ................................... | 395/732 |
| 4,831,286 | 5/1989 | Garcia et al. ............................ | 327/218 |
| 4,933,575 | 6/1990 | Aso .......................................... | 327/218 |
| 4,972,313 | 11/1990 | Getson, Jr. et al. ..................... | 395/305 |

(List continued on next page.)

FOREIGN PATENT DOCUMENTS

| | | |
|---|---|---|
| 0 285 892 A3 | 10/1988 | European Pat. Off. . |
| 0 573 326 A1 | 12/1993 | European Pat. Off. . |
| 43 20 681 A1 | 1/1994 | Germany . |
| 3018814 | 1/1988 | Japan .................................... 327/203 |
| 63-16710 | 1/1988 | Japan .................................... 327/211 |
| 1024504 | 1/1989 | Japan .................................... 327/203 |
| 1024505 | 1/1989 | Japan .................................... 327/203 |

(List continued on next page.)

OTHER PUBLICATIONS

International Search Report for International Application No. PCT/US96/00676 dated Jun. 25, 1996, 7 pages.
International Search Report for International Application No. PCT/US96/02543 dated Jul. 25, 1996, 6 pages.
G.A. Maley and D.W. Westcott, "IBM Technical Disclosure Bulletin," vol. 25 No. 9, Feb. 1983, 2 pages.
Frank Gonzalez, Design Ideas, "Spare inverters form a transparent D latch," 2119 EDN–Electrical Design News, Apr. 28, 1988, No. 9, 1 page.
Robert R. Puckett, "Standard Schottky TTL ICs emulate MOS logic designs," vol. 31, Mar. 1983, No. 6, 5 pages.

*Primary Examiner*—Timothy P. Callahan
*Assistant Examiner*—Eunja Shin
*Attorney, Agent, or Firm*—Conley, Rose & Tayon PC; B. Noel Kivlin

[57] ABSTRACT

A conditional latch circuit is provided wherein a first transmission gate is electrically coupled in series with a second transmission gate between an input node and an output node. The latch circuit is controlled by a conditional clock signal wherein a delay element is employed to cause both transmission gates to be simultaneously enabled upon an edge of the conditional clock signal. The length of time during which both transmission gates are enabled is determined by an electrical delay associated with the delay element. When both transmission gates are enabled, the input node is electrically coupled to the output node. A keeper circuit at the output of the second transmission gate retains a logical value at the output of the latch after the input node is decoupled from the output line by disabling the first transmission gate. An edge of the conditional clock signal which causes a new input value to be latched within the latch circuit is driven by a logic gate which receives a clock signal at a first input, a condition signal at a second input, and an inhibit signal at a third input. The inhibit signal is provided from an inhibit signal generator and is provided to prevent the false-firing of the latch if the condition signal is asserted while the clock signal is active.

9 Claims, 6 Drawing Sheets

U.S. PATENT DOCUMENTS

| | | | |
|---|---|---|---|
| 4,974,148 | 11/1990 | Matteson | 395/559 |
| 5,015,875 | 5/1991 | Giles et al. | 327/203 |
| 5,105,100 | 4/1992 | Yamada | 327/202 |
| 5,124,572 | 6/1992 | Mason et al. | 327/145 |
| 5,227,674 | 7/1993 | Takahashi et al. | 327/202 |
| 5,239,206 | 8/1993 | Yanai | 327/202 |
| 5,280,203 | 1/1994 | Hung et al. | 327/202 |
| 5,317,205 | 5/1994 | Sato | 327/199 |
| 5,357,144 | 10/1994 | Tanaka | 327/202 |
| 5,392,033 | 2/1995 | Oman et al. | 370/462 |
| 5,459,421 | 10/1995 | Shaw | 327/203 |
| 5,463,624 | 10/1995 | Hogg et al. | 370/461 |
| 5,533,205 | 7/1996 | Blackledge, Jr. et al. | 395/297 |
| 5,572,686 | 11/1996 | Nunziata et al. | 395/296 |
| 5,574,867 | 11/1996 | Khaira | 395/293 |

FOREIGN PATENT DOCUMENTS

| | | | |
|---|---|---|---|
| 1241913 | 9/1989 | Japan | 327/202 |
| 2-104016 | 4/1990 | Japan . | |
| 4220810 | 8/1992 | Japan | 327/203 |
| 5-110386 | 4/1993 | Japan | 327/199 |
| 5-110387 | 4/1993 | Japan | 327/199 |
| 5-110391 | 4/1993 | Japan | 327/218 |
| 5-206792 | 8/1993 | Japan | 327/199 |
| 5335899 | 12/1993 | Japan | 327/202 |
| 6-45879 | 2/1994 | Japan . | |

CONDITIONAL LATCHING MECHANISM AND PIPELINED MICROPROCESSOR EMPLOYING THE SAME

This application is a continuation of application Ser. No. 08/400,608 filed Mar. 8, 1995 now abandoned.

BACKGROUND OF THE INVENTION

1. Field of the Invention

This invention relates to high-speed conditional latching mechanisms. The invention also relates to pipelined microprocessors that employ conditional latching mechanisms between pipeline stages.

2. Description of the Relevant Art

Almost all modern microprocessors use a technique called pipelining to increase throughput at relatively low cost. Pipelining involves partitioning a process with "n" steps into "n" hardware stages separated by memory elements called registers which hold intermediate results. There is one pipeline stage for each step in the process, and these stages are connected in the same order that the steps are performed. By allowing each of the "n" stages to operate concurrently, the pipelined process can potentially operate at nearly "n" times the rate of a non-pipelined process.

Pipelining is desirable when the propagation delay times of the stages are large relative to the propagation delay times of the registers. If the propagation delay times associated with the registers are significant compared to the propagation delay times of the stages, the performance benefits of pipelining are diminished. The propagation delay times of the registers continue to be barriers to achieving a theoretical "n"-fold increase in throughput. As a result, particularly close attention is paid to the designs of registers between pipeline stages in microprocessors. Every effort is made to minimize the propagation delay times of these registers.

A plurality of single latches is often used to implement a register coupled between stages in a pipelined microprocessor. FIG. 1 is a schematic diagram of a typical single latch employed between pipeline stages wherein a clock signal CLK and its complement are provided to control a transmission gate 104. When the CLK signal is logic high, transmission gate 104 is enabled, thereby electrically coupling input signal IN to node A. Inverter 106 drives output terminal OUT with the complement of the logical value at node A. Inverter 108 is a "trickle" feedback inverter provided to retain the logical value at node A after transmission gate 104 is disabled. Such a trickle inverter is characterized as a "weak" inverter whereby its output may be overpowered by the input signal IN when transmission gate 104 is enabled.

The simplicity of single latches results in relatively short propagation delay times and low costs. For the latch circuit of FIG. 1, output signal OUT is the logical complement of the input signal IN as long as clock signal CLK is logic high, and remains the logical complement of the last value of IN when CLK transition to logic low. This "transparency" property of latches may cause timing problems if the same clock signal is used to control the latch circuits associated with two successive pipeline stages. That is, if the latches of two successive pipeline stages are enabled simultaneously for a period of time longer than the propagation delay time of the first pipeline stage, a timing problem typically referred to as a race condition is created. When a race condition occurs, changes in logic levels may pass through the first stage and prematurely into the second stage during the same clock cycle, thus leading to logic errors. Therefore, to eliminate possible race conditions, pipelined processors have long employed a technique of supplying alternate latches with clock signals which do not overlap (i.e., never enable two successive latches simultaneously).

Many latch circuits employed between stages in pipelined processors are further implemented in conditional latching configurations wherein an output from a first pipeline stage is stored within the latch only upon assertion of a condition signal. That is, an advancement of the pipeline may be made conditional depending upon assertion of a condition signal. If the condition signal is not asserted upon a given clock edge, the pipeline stage is held in its current state. A typical implementation of a conditional latch circuit employs combinational logic such as a NOR-AND gate combination at the input node of the latch to conditionally refresh the latch at its current state if the condition signal is not asserted.

As integrated circuit manufacturing processes improve, more and more devices and their interconnections are placed on a single dice or "chip." For very high speed microprocessors, the ability to generate and distribute high resolution two-phase clock signals which do not overlap is greatly diminished due to the capacitive loading on the clock drivers. "Clock skew" occurs when two clock signals travel along different paths with different delay times, arriving at different latches at different times. If this clock skew is severe enough, one clock signal may overlap the other, thus creating the possibility of race conditions as discussed previously. Relatively slow rise and fall times of the clock signals may further increase the effective overlapping.

In addition to the foregoing, for conditional latching mechanisms the inclusion of combinational logic such as a NOR-AND gate combination at the input node of the latch increases the propagational delay associated with the latch. Therefore, a large percentage of the usable duty cycle of the clock signal in pipeline processors may be consumed by the conditional latch, particularly as frequencies increase.

SUMMARY OF THE INVENTION

The problems outlined above are in large part solved by a high-speed conditional latching mechanism in accordance with the present invention. In one embodiment, a conditional latch circuit is provided wherein a first transmission gate is electrically coupled in series with a second transmission gate between an input node and an output node. The latch circuit is controlled by a conditional clock signal wherein a delay element is employed to cause both transmission gates to be simultaneously enabled upon an edge of the conditional clock signal. Enabled is defined as the condition when the input of a transmission gate is electrically coupled, in a low impedance state, to its output, as a result a logical high signal being applied to the gate of its n-channel transistor and a logical low signal being applied to the gate of its p-channel transistor. The length of time during which both transmission gates are enabled is determined by an electrical delay associated with the delay element. When both transmission gates are enabled, the input node is electrically coupled to the output node. A keeper circuit at the output of the second transmission gate retains a logical value at the output of the latch after the input node is decoupled from the output line by disabling the first transmission gate. In one implementation, the delay element is implemented with one or more serially coupled inverters, and the length of the time delay controls a time window during which both transmission gates are enabled.

In one embodiment, an edge of the conditional clock signal which causes a new input value to be latched within the latch circuit is driven by a logic gate which receives a clock signal at a first input, a condition signal at a second input, and an inhibit signal at a third input. The inhibit signal is provided from an inhibit signal generator and is provided to prevent the false-firing of the latch if the condition signal is asserted while the clock signal is active. For a negative edge triggered latch, the clock signal is referred to as being active when low, while for a positive edge triggered latch, the clock signal is referred to as being active when high. In one embodiment, the inhibit signal generator includes at least one inverter coupled to receive the clock signal. The inhibit signal is representative of an inverted and slightly delayed version of the clock signal. The inhibit signal is thus advantageously deasserted during active portions of the clock signal, thus preventing the occurrence of an edge of the conditional clock signal until a subsequent triggering-edge of the clock signal.

In an alternative implementation of the inhibit signal generator, upon an edge of the clock signal the condition signal is sampled. If the condition signal is deasserted high, the inhibit signal at the output of the inhibit signal generator is also deasserted high until the clock signal returns high, at which time the inhibit signal is again asserted low. Thus, if the condition signal is asserted while the clock signal is active (i.e., low), the latch circuit will not false-fire since the inhibit signal will be deasserted high. Upon the next falling edge of the clock signal when the condition signal is asserted, the latch will properly fire. Employment of the inhibit signal generator advantageously prevents the false-firing of the latch circuit when the condition signal is asserted while the clock signal is active.

When employed between stages in a pipelined microprocessor, the conditional latch circuit advantageously allows operation with a single clock signal with relatively low transistor count. High frequencies of operation of the pipelined microprocessor are accommodated since the propagation time associated with the latch circuit is relatively low. Accordingly, the percent of delay cycle time utilized by the pipeline latch is relatively low. Race conditions may further be eliminated and capacitive loading of the clock driver may be reduced. In addition, by modifying the delay characteristics of the delay element, the conditional latch circuit may be adjusted to operate optimally even if a new process technology is employed in fabrication to replace the one it was originally manufactured in.

Broadly speaking, the present invention contemplates a conditional latch circuit including a plurality of transmission gates serially coupled between an input line and an output line of the latch circuit. A first of the plurality of the transmission gates is controlled by a conditional clock signal. A delay element is coupled to a second of the plurality of transmission gates, wherein the second of the plurality of transmission gates is controlled by a delayed version of the conditional clock signal such that an edge of the conditional clock signal results in a simultaneous enablement of the plurality of transmission gates. A control circuit is coupled to the first transmission gate for generating an edge in the conditional clock signal depending upon an assertion of a condition signal.

BRIEF DESCRIPTION OF THE DRAWINGS

Other objects and advantages of the invention will become apparent upon reading the following detailed description and upon reference to the accompanying drawings in which.

Figure 1:
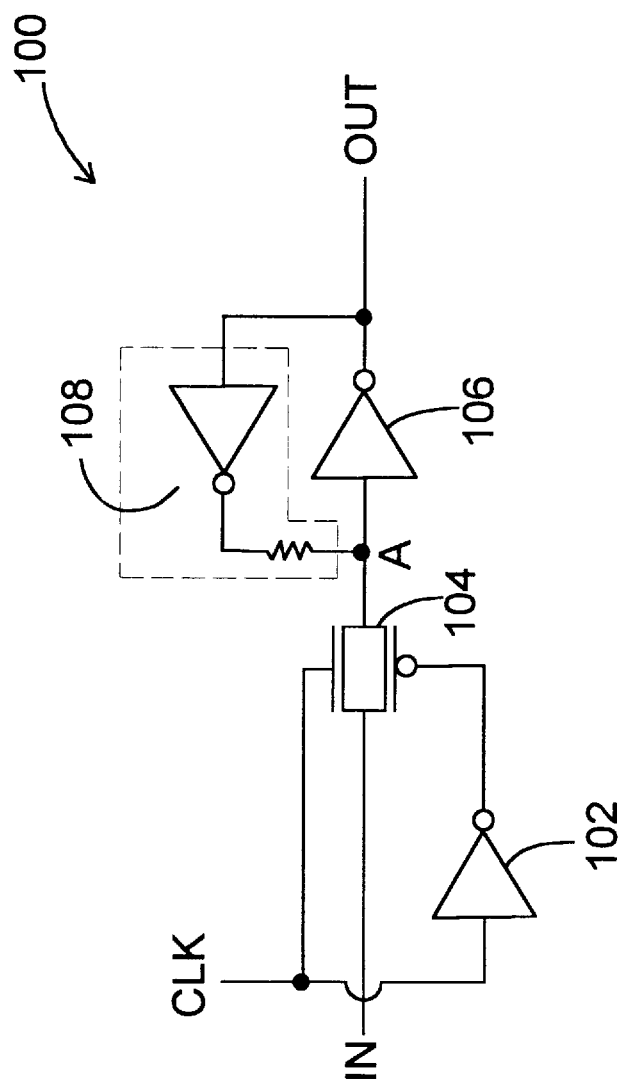
FIG. 1 is a schematic diagram of a typical static latch.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
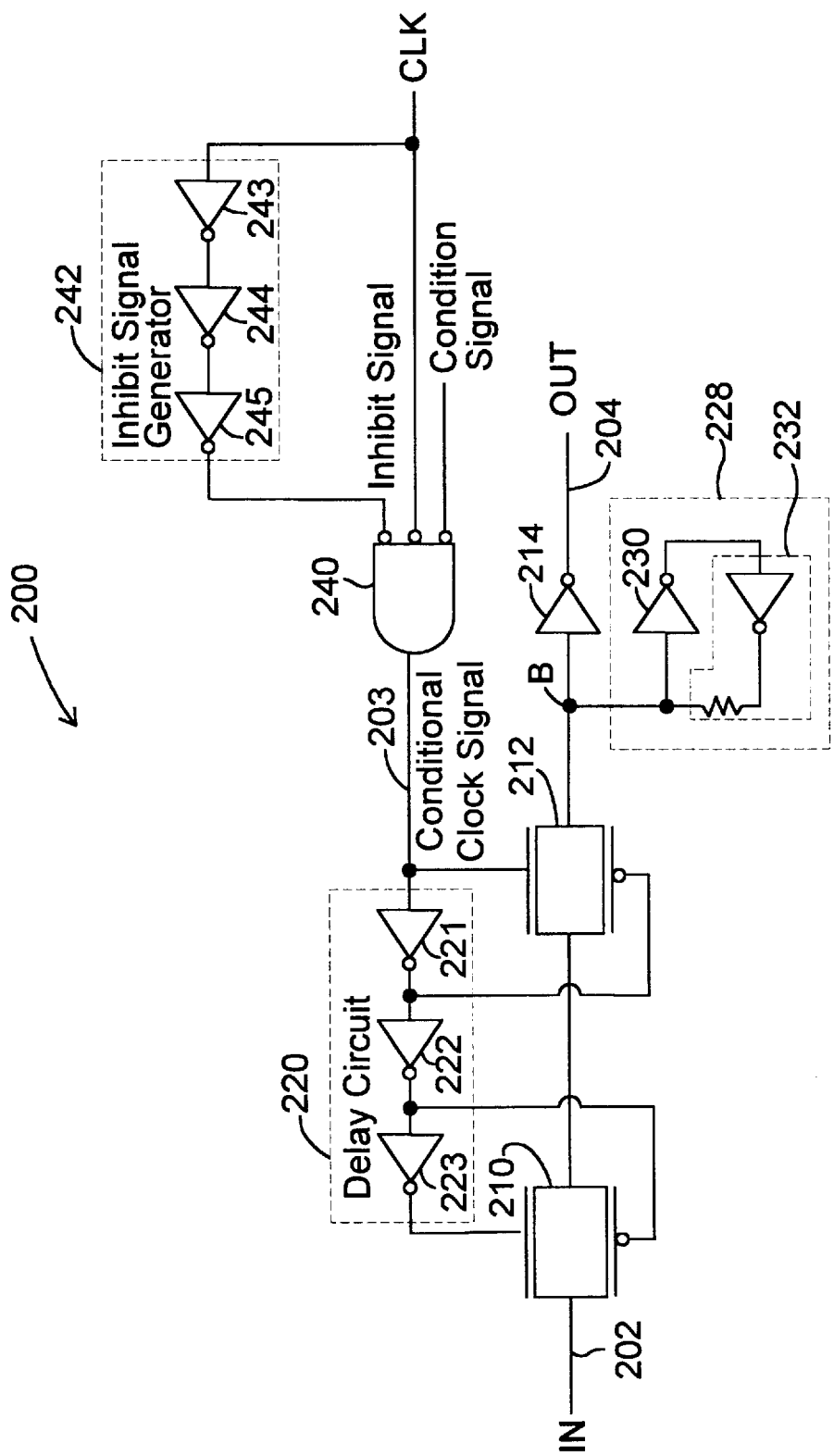
FIG. 2 is a schematic diagram of a conditional latch circuit in accordance with one embodiment of the present invention.

Referring next to FIG. 2, a schematic diagram of a conditional latch circuit 200 in accordance with the present invention is shown. The conditional latch circuit 200 is configured to conditionally latch a signal IN at an input node 202 upon the rising edge of a conditional clock signal at a node 203. An inverted output signal OUT is driven at an output node 204. As will be understood from the following, the conditional clock signal at line 203 transitions high only upon occurrence of a falling edge of a clock signal CLK when both a "condition" and an "inhibit" signal are also asserted low.

Conditional latch circuit 200 includes a transmission gate 210, a transmission gate 212 and an inverter 214 coupled in series between the input node 202 and the output node 204. A delay circuit 220 including inverters 221–223 is further coupled to receive the conditional clock signal at node 203. A keeper circuit 228 is further shown coupled to an input of inverter 214, and a NOR gate 240 is shown coupled to delay circuit 220. An inhibit generator 242 including inverters 243–245 is finally shown coupled to NOR gate 240.

Keeper circuit 228 is illustrated with an inverter 230 coupled to a trickle inverter 232. As will be appreciated by those of skill in the art, keeper circuit 228 is employed to ensure that the logical value at node B is maintained even after an input signal IN is electrically decoupled from node B (i.e., by disabling transmission gate 210). Inverter 230 has as its input the logical value at node B and its output drives the logical complement of the logical value at node B. Inverter 232 is a weak "trickle" inverter which has as its input the logical complement of the logical value at node B, and its output drives node B with the same logic value present at node B. Thus, trickle inverter 232 enables the keeper circuit to maintain the logic value at node B, and yet allow the logical value at node B to be overpowered (and thus changed) by input signal IN.

Figure 3:
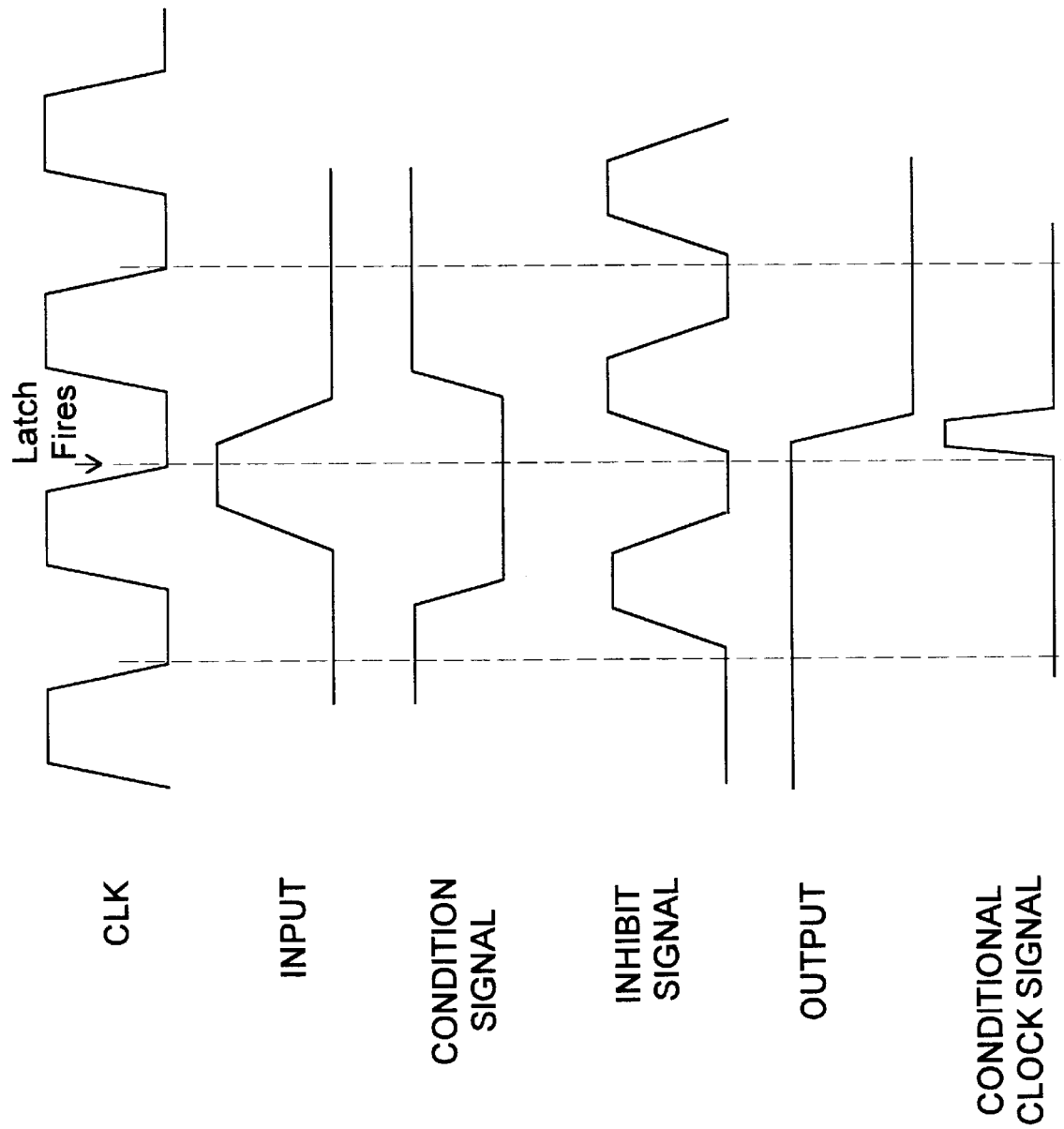
FIG. 3 is a timing diagram associated with the operation of the conditional latch circuit of FIG. 2.

The operation of conditional latch circuit 200 will next be described in conjunction with the timing diagram of FIG. 3. Referring collectively to FIGS. 2 and 3, the conditional clock signal transitions high only upon an occurrence when the condition signal, the clock signal CLK, and the inhibit signal are simultaneously low. It is noted that upon an edge where the conditional clock signal transitions high, transmission gate 212 turns on. For a brief period as determined by delay circuit 220, the transmission gate 210 further remains on, thus statically driving the input signal in to node B. Shortly thereafter when the high transition of the conditional clock signal propagates through the delay circuit 220, transmission gate 210 turns off. The logic value at node B is thereafter retained by keeper circuit 228 until the occurrence of another firing of the conditional latch circuit 200 (i.e., upon a subsequent rising edge of the conditional clock signal). This operation is similar to that of the latch circuit described within the copending, commonly assigned patent application entitled "A High-Speed Latch Circuit Employing Multiple Transmission Gates"; Ser. No. 08/377,864, filed Jan. 25, 1995 by Pflum et al., the disclosure of which is incorporated herein by reference in its entirety.

As stated previously, the conditional clock signal transitions high only upon an occurrence when the inhibit signal, the clock signal CLK, and the condition signal are simultaneously driven low. For the implementation of FIG. 2, the inhibit signal provided from the inhibit signal generator 242 is an inverted, slightly delayed version of the clock signal CLK. As a result, only upon a short duration when the clock signal CLK falls low is the inhibit signal also low. At all other times, either the clock signal and/or the inhibit signal is high. As illustrated in FIG. 3, when the condition signal is high and a falling edge of the clock signal CLK occurs, the latch circuit will not fire. When the condition signal is later asserted low, the latch circuit does not fire immediately since the inhibit signal is still high at this point. Only upon the subsequent falling edge of the clock signal while the condition signal is also asserted low does the latch fire. Upon the firing of the latch as illustrated in the example of FIG. 3, the output signal is driven low since the input signal was sampled high upon the falling edge of the clock signal. This output signal is retained until the next conditional latching event.

Figure 4:
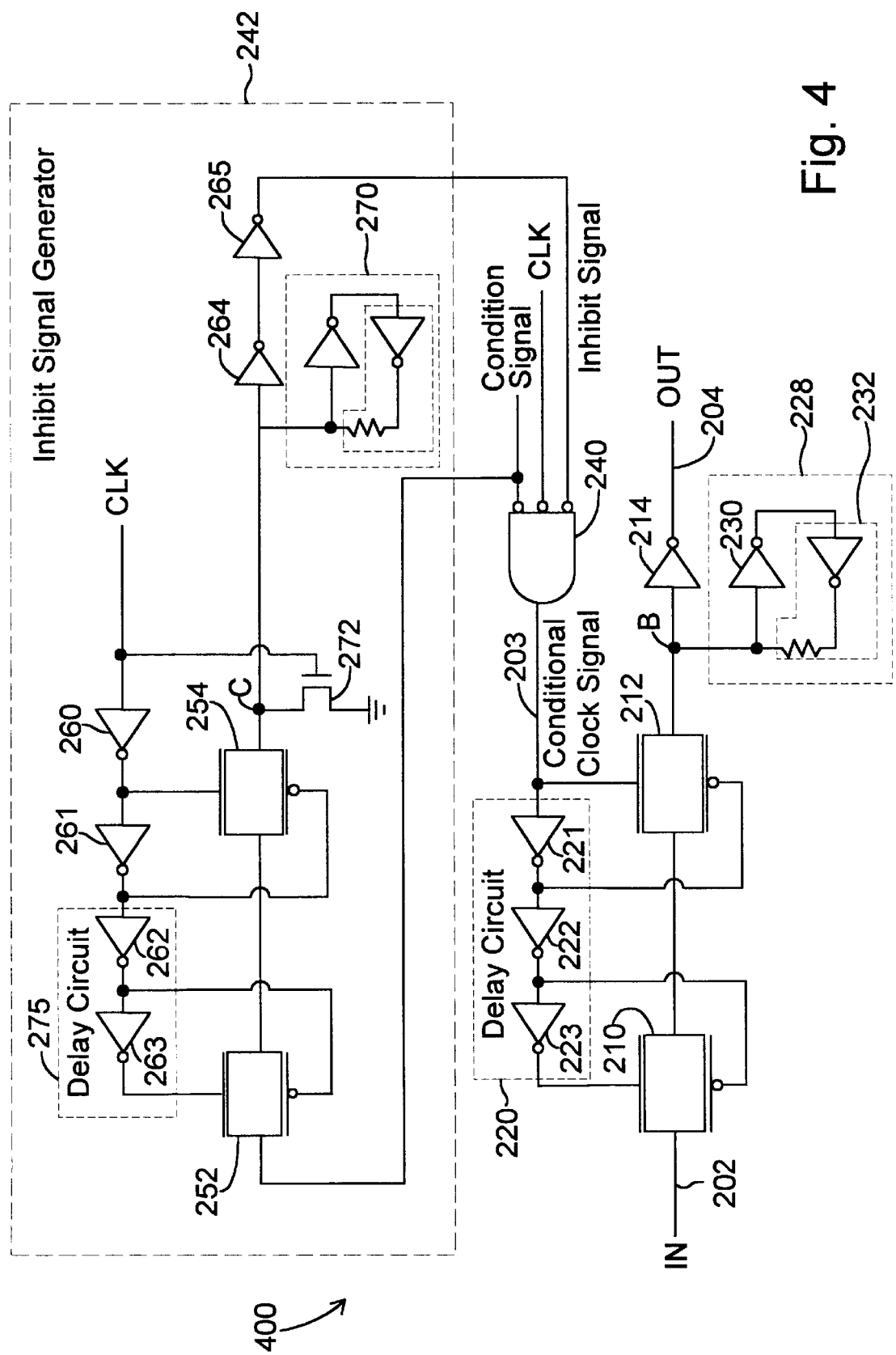
FIG. 4 is a block diagram of a conditional latch circuit in accordance with another embodiment of the present invention.

Turning next to FIG. 4, a schematic diagram of a conditional latch circuit 400 in accordance with another embodiment of the present invention is shown. The conditional latch circuit of FIG. 4 is similar to that of FIG. 2 with the exception of the configuration of the inhibit signal generator 242. Circuit portions that correspond to those of FIG. 2 are numbered identically for simplicity and clarity.

The inhibit signal generator 242 of FIG. 4 includes transmission gates 252 and 254, inverters 260–265, a keeper circuit 270, and a field effect transistor 272. As will be understood more fully from the following discussion, the inhibit signal generator 242 is configured to sample the condition signal upon each falling edge of the clock signal CLK. Following each falling edge of the clock signal, an inhibit signal from the inhibit signal generator 242 is driven with the value of the sampled condition signal. Subsequently, when the clock signal goes high, the inhibit signal generator 242 resets such that the inhibit signal is driven low.

Figure 5:
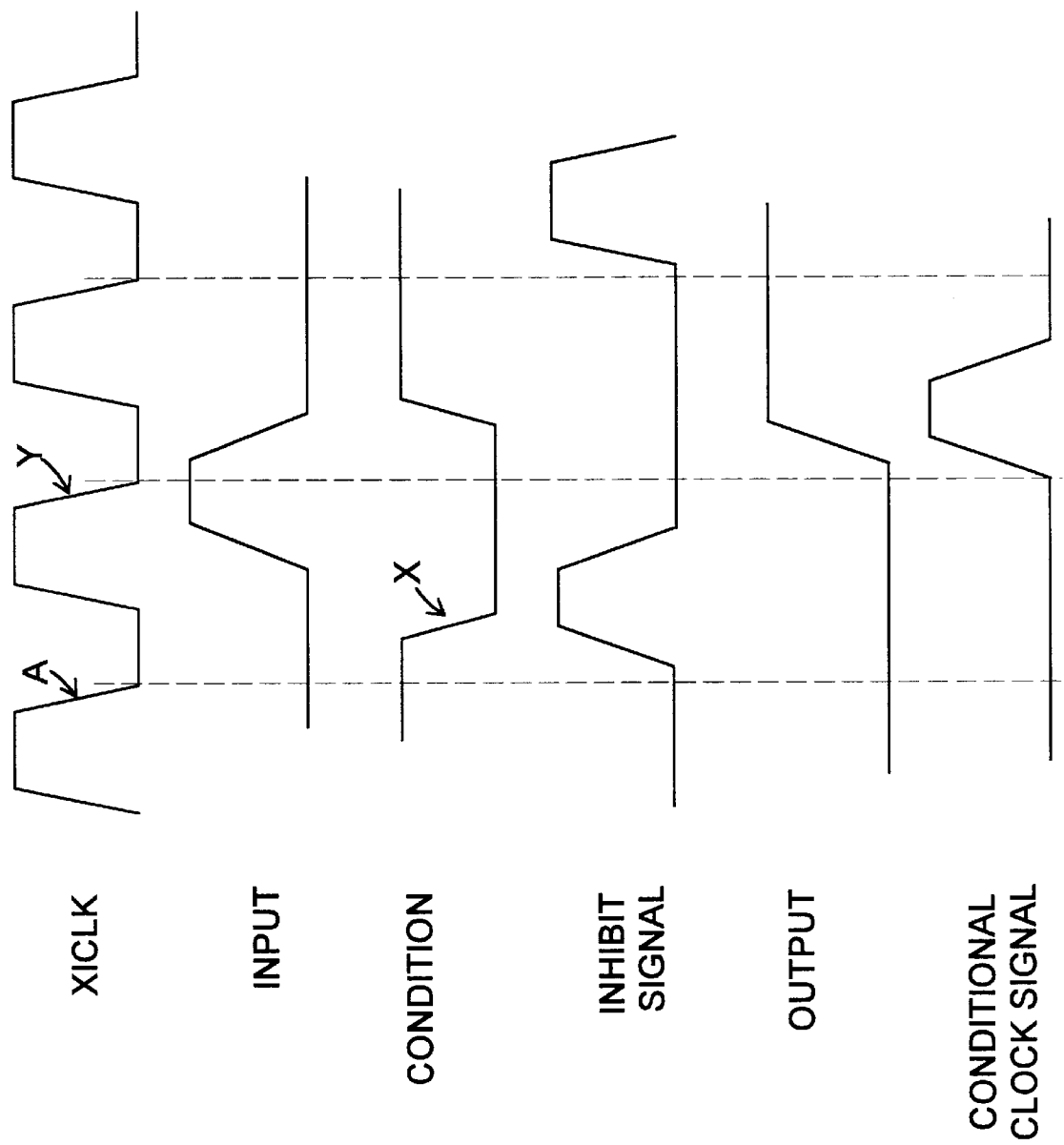
FIG. 5 is a timing diagram associated with the operation of the conditional latch circuit of FIG. 4.

Details regarding the operation of conditional latch circuit 400 will next be described in conjunction with a timing diagram of FIG. 5. Referring collectively to FIGS. 4 and 5, the condition signal is sampled by inhibit signal generator 242 upon each falling edge of the clock signal CLK. Thus, as shown in FIG. 5 when the clock signal falls low at point A, the reset signal goes high in accordance with the sampled condition signal. Upon the next rising edge of the clock signal, the reset signal resets low. It is noted that this operation occurs since transistor 272 is driven on during the high phase of the clock signal, thus causing the inhibit signal to be driven low. It is further noted that when the clock signal falls low, the condition signal is sampled by the inhibit signal generator 242 since both transmission gate 252 and transmission gate 254 are driven on (simultaneously) for a short period as the edge propagates through delay circuit 275. This causes node C to be driven with the value of the condition signal. The keeper circuit 270 thereafter holds this value after transmission gate 252 turns off, and until the circuit is reset by turning on transistor 272 (i.e., during the high phase of the clock signal CLK).

The condition signal is asserted when it is desired to latch an input signal at node 202 into the conditional latch circuit 400. As illustrated in FIG. 5, the condition signal is asserted low at a point X. However, since the inhibit signal is high at this point, the conditional clock signal at line 203 does not transition high at this point. Upon the next falling edge of the clock signal CLK at point Y, the condition signal is again sampled. Since the condition signal is low at this point, the inhibit signal remains low. Accordingly, since at this point all inputs to NOR gate 240 are low, the conditional clock signal at line 203 is driven high. As stated previously, this causes the conditional latch circuit 400 to fire. The conditional clock signal subsequently falls low upon the next rising edge of the clock signal CLK (or upon deassertion of the condition signal). It is noted that the inhibit signal generator 242 of FIG. 4 drives the conditional clock signal high for approximately one-half of the period of the clock signal CLK.

It is further noted that while the embodiments described above employ a NOR gate 240 for driving the conditional clock signal high upon a latching event, other logic circuits could alternatively be employed. Similarly, while the conditional latch described in the above configurations fires upon a rising edge of the conditional clock signal, it is understood that the conditional latch circuit could alternatively be configured such that it fires upon a falling edge of the conditional clock signal.

Figure 6:
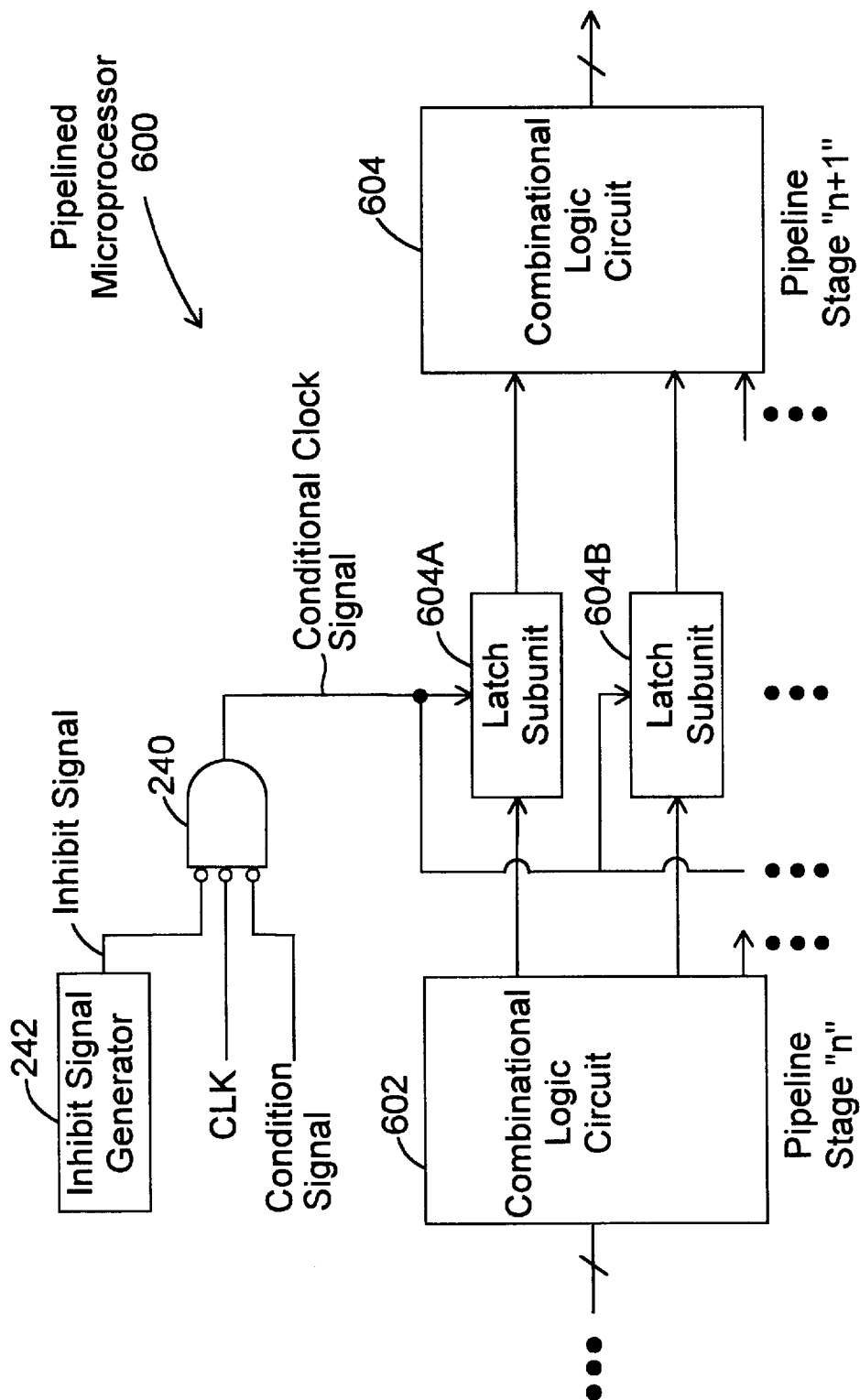
FIG. 6 is a block diagram of a pipelined microprocessor employing latches controlled by a single system clock in accordance with the present invention.

Turning next to FIG. 6, a block diagram of a generalized portion of a pipelined microprocessor 600 is shown which employs a conditional latch circuit in accordance with the present invention. As illustrated in FIG. 6, a combinational logic circuit 602 is coupled to a second combinational logic circuit 604 through a plurality of latch subunits 604A and 604B. Combinational logic circuits 602 and 604 form successive pipeline stages within pipelined microprocessor 600. Each of the latch subunits 604 is representative of that portion of the circuitry within the conditional latch circuit 400 of FIG. 4 which is formed by transmission gates 210 and 212, inverters 214 and 221–223, and keeper circuit 228. Each of the latch subunits 604 receives a common conditional clock signal from NOR gate 240. A common inhibit signal generator 242 which may be embodied, for example, in accordance with either of the inhibit signal generators 242 of FIGS. 2 or 4, is used to generate the inhibit signal.

The pipelined microprocessor 600 allows the conditional latching of signals from combinational logic circuit 602 into the latch subunit 604 to advance the pipeline depending upon the condition signal. The pipelined microprocessor 600 is capable of operating from a single phase clock signal CLK to thereby support extremely high frequencies of operation. Furthermore, each latch subunit 604A is associated with a relatively low delay, thus also accommodating high frequencies of microprocessor operation. Since a common inhibit signal generator 242 is employed to generate the conditional clock signal which controls several latch subunits 604, transistor count may be reduced.

Numerous variations and modifications will become apparent to those skilled in the art once the above disclosure is fully appreciated. For example, in the embodiments described above, the inhibit signal generator 242 in combination with the NOR gate 240 collectively form a control circuit for generating an edge in the conditional clock signal at line 203. It is understood that other implementations of a control circuit for generating an edge in the conditional clock signal depending upon the condition signal could be alternatively employed. It is intended that the following claims be interpreted to embrace all such variations and modifications.

What is claimed is:

1. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal, and wherein said control circuit is configured to generate said edge of said conditional clock signal upon an edge of a clock signal when said condition signal is asserted, and wherein said control circuit comprises an inhibit signal generator configured to sample said condition signal in response to an edge of said clock signal.

2. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently;

a logic circuit coupled to said first transmission gate for providing said conditional clock signal, wherein said logic circuit includes a first input node for receiving a condition signal, a second node for receiving a clock signal, and a third input node for receiving an inhibit signal, wherein said logic circuit generates said edge of said conditional clock signal upon a predetermined state of said condition signal, said clock signal, and said inhibit signal; and an inhibit signal generator coupled to said logic circuit, wherein said inhibit signal generator is configured to generate said inhibit signal such that said logic circuit is inhibited from generating said edge of said conditional clock signal during a portion of time during which said condition signal is asserted; and wherein said inhibit signal generator is configured to sample said condition signal in response to an edge of said clock signal.

3. A pipelined microprocessor comprising:

a first combinational logic circuit forming a first pipelined stage within said microprocessor;

a second combinational logic circuit forming a subsequent pipelined stage within said microprocessor; and a conditional latch circuit coupled between an output line of said first combinational logic circuit and an input line of said second combinational logic circuit, said conditional latch circuit including:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal, wherein said control circuit is configured to generate said edge of said conditional clock signal upon an edge of a clock signal when said condition signal is asserted, and wherein said control circuit comprises an inhibit signal generator configured to sample said condition signal in response to an edge of said clock signal.

4. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal;

wherein said keeper circuit is a sole active storage device within said conditional latch circuit and is coupled to an output node of said first of said plurality of transmission gates, said output node coupling to said output line.

5. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled;

a logic circuit coupled to said first transmission gate for providing said conditional clock signal, wherein said logic circuit includes a first input node for receiving a condition signal, a second node for receiving a clock signal, and a third input node for receiving an inhibit signal, wherein said logic circuit generates said edge of said conditional clock signal upon a predetermined state of said condition signal, said clock signal, and said inhibit signal; and an inhibit signal generator coupled to said logic circuit, wherein said inhibit signal generator is configured to generate said inhibit signal such that said logic circuit is inhibited from generating said edge of said conditional clock signal during a portion of time during which said condition signal is asserted;

wherein said keeper circuit is a sole active storage device within said conditional latch circuit and is coupled to an output node of said first of said plurality of transmission gates, said output node coupling to said output line.

6. A pipelined microprocessor comprising:

a first combinational logic circuit forming a first pipelined stage within said microprocessor;

a second combinational logic circuit forming a subsequent pipelined stage within said microprocessor; and a conditional latch circuit coupled between an output line of said first combinational logic circuit and an input line of said second combinational logic circuit, said conditional latch circuit including:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal;

wherein said keeper circuit is a sole active storage device within said conditional latch circuit and is coupled to an output node of said first of said plurality of transmission gates, said output node coupling to said input line.

7. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal;

wherein a terminal of said second transmission gate is directly connected to a terminal of said first transmission gate through a passive connection.

8. A conditional latch circuit including an input line and an output line comprising:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled;

a logic circuit coupled to said first transmission gate for providing said conditional clock signal, wherein said logic circuit includes a first input node for receiving a condition signal, a second node for receiving a clock signal, and a third input node for receiving an inhibit signal, wherein said logic circuit generates said edge of said conditional clock signal upon a predetermined state of said condition signal, said clock signal, and said inhibit signal; and an inhibit signal generator coupled to said logic circuit, wherein said inhibit signal generator is configured to generate said inhibit signal such that said logic circuit is inhibited from generating said edge of said conditional clock signal during a portion of time during which said condition signal is asserted;

wherein a terminal of said second transmission gate is directly connected to a terminal of said first transmission gate through a passive connection.

9. A pipelined microprocessor comprising:

a first combinational logic circuit forming a first pipelined stage within said microprocessor;

a second combinational logic circuit forming a subsequent pipelined stage within said microprocessor; and a conditional latch circuit coupled between an output line of said first combinational logic circuit and an input line of said second combinational logic circuit, said conditional latch circuit including:

a plurality of transmission gates serially coupled between said input line and said output line, wherein a first of said plurality of said transmission gates is controlled by a conditional clock signal;

a keeper circuit coupled to a node between said input line and said output line;

a delay element coupled to a second of said plurality of transmission gates, wherein said second of said plurality of transmission gates is controlled by a delayed version of said conditional clock signal, whereby an edge of said conditional clock signal results in said plurality of transmission gates being enabled concurrently, and wherein a node between said first transmission gate and said second transmission gate is floated when said second transmission gate is not enabled; and a control circuit coupled to said first transmission gate for generating said conditional clock signal, wherein said control circuit includes a first input node for receiving a condition signal, and wherein an occurrence of said edge of said conditional clock signal is dependent upon an assertion of said condition signal;

wherein a terminal of said second transmission gate is directly connected to a terminal of said first transmission gate through a passive connection.

\* \* \* \* \*